(12) United States Patent
Huang et al.

(10) Patent No.: US 9,904,121 B2
(45) Date of Patent: Feb. 27, 2018

(54) ARRAY SUBSTRATE, LIQUID CRYSTAL DISPLAY PANEL, AND ITS LIQUID CRYSTAL DISPLAY DEVICE

(71) Applicant: Shenzhen China Star Optoelectronics Technology Co., Ltd., Shenzhen, Guangdong (CN)

(72) Inventors: Shishuai Huang, Guangdong (CN); Cheng-hung Chen, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 328 days.

(21) Appl. No.: 14/784,282

(22) PCT Filed: Aug. 12, 2015

(86) PCT No.: PCT/CN2015/086741
§ 371 (c)(1),
(2) Date: Oct. 13, 2015

(87) PCT Pub. No.: WO2017/020334
PCT Pub. Date: Feb. 9, 2017

(65) Prior Publication Data
US 2017/0153508 A1 Jun. 1, 2017

(30) Foreign Application Priority Data
Aug. 4, 2015 (CN) .......................... 2015 1 0470368

(51) Int. Cl.
*G02F 1/136* (2006.01)
*G02F 1/1343* (2006.01)
(Continued)

(52) U.S. Cl.
CPC ...... *G02F 1/134309* (2013.01); *G02F 1/1368* (2013.01); *G02F 1/133345* (2013.01);
(Continued)

(58) Field of Classification Search
CPC ..... G02F 1/13624; G02F 2001/134354; G02F 1/136213
See application file for complete search history.

(56) References Cited

U.S. PATENT DOCUMENTS

2008/0186304 A1  8/2008  You et al.
2009/0225018 A1  9/2009  Kim
(Continued)

*Primary Examiner* — Phu Vu
(74) *Attorney, Agent, or Firm* — Andrew C. Cheng

(57) ABSTRACT

The present invention provides an array substrate. The array substrate includes a base substrate, a first metal layer, an insulating layer, and a second metal layer subsequently formed on the base substrate. The first metal layer is scan lines or charge sharing lines of the array substrate. The second metal layer is one of a source electrode and drain electrode of a charge sharing thin film transistor of the array substrate. The first metal layer, the second metal layer, and the insulating layer between them stack together to form a charge sharing capacitor of the array substrate. The present invention further provides the liquid crystal display panel and the liquid crystal display device with the above-mentioned array substrate. By means of array substrate, the present invention can increase the pixel aperture ratio.

17 Claims, 4 Drawing Sheets

(51) Int. Cl.
    *G02F 1/1333*    (2006.01)
    *G02F 1/1368*    (2006.01)
    *G02F 1/1362*    (2006.01)
    *G02F 1/1335*    (2006.01)

(52) U.S. Cl.
    CPC .. *G02F 1/133514* (2013.01); *G02F 1/136213* (2013.01); *G02F 1/136286* (2013.01); *G02F 1/13624* (2013.01); *G02F 2001/134354* (2013.01); *G02F 2201/121* (2013.01)

(56) References Cited

U.S. PATENT DOCUMENTS

| | | |
|---|---|---|
| 2010/0231819 A1* | 9/2010 | Lee ................ G02F 1/1343 349/43 |
| 2011/0115998 A1 | 5/2011 | Liao et al. |
| 2011/0156993 A1 | 6/2011 | Ting et al. |
| 2014/0146032 A1 | 5/2014 | Tsao et al. |
| 2015/0015821 A1 | 1/2015 | Lo et al. |
| 2016/0111443 A1 | 4/2016 | Huan |
| 2016/0246092 A1 | 8/2016 | Huang |
| 2016/0291367 A1 | 10/2016 | Cheng et al. |
| 2016/0306242 A1 | 10/2016 | Chen hung et al. |
| 2016/0342051 A1 | 11/2016 | Wang |
| 2017/0139295 A1 | 5/2017 | Yi |

* cited by examiner

ARRAY SUBSTRATE, LIQUID CRYSTAL DISPLAY PANEL, AND ITS LIQUID CRYSTAL DISPLAY DEVICE

FIELD

The present invention relates to liquid crystal display technology, more particularly to an array substrate, a liquid crystal display panel, and its liquid crystal display device.

BACKGROUND

In order to improve color shift phenomenon of the liquid crystal display (LCD) at large viewing angle, the prior art technology applies charge sharing pixel design. That is, one pixel is divided to a main pixel region and a sub pixel region. During displaying, the scanning line is charged and the charge sharing line is turned off, and the main pixel region and the sub pixel region are charged to the same electric potential. Then, the scanning line is turned off and the charge sharing line is turned on. Due to the effect of the charge sharing capacitor, the sub pixel region has a lower electric potential than the main pixel region. Different electric potentials make the liquid crystal molecules in these two regions to have different orientation, thus improving color shift at large viewing angle. However, one metal layer forming the charge sharing capacitor is the common electrode signal line in the display region. The shielding metal layer will occupy area of the display region, thus decreasing pixel aperture ratio.

SUMMARY

In view of the above problem, the present invention provides an array substrate, a liquid crystal display panel, and a liquid crystal display device, in order to increase pixel aperture ratio.

According to embodiments of the present invention, the array substrate includes a base substrate, a first metal layer, an insulating layer, and a second metal layer subsequently formed on the base substrate. The first metal layer is scan lines or charge sharing lines of the array substrate. The second metal layer is one of a source electrode and drain electrode of a charge sharing thin film transistor of the array substrate. The first metal layer, the second metal layer, and the insulating layer between them are stacked together to form a charge sharing capacitor of the array substrate.

The array substrate is divided to a plurality of pixel units. Each of the pixel units includes a main pixel region, a sub pixel region, and a trace region between the two pixel regions. Each of the pixel units is connected to one of the scanning lines and one of the charge sharing lines. One of the scanning lines and one of the charge sharing lines are disposed side by side in the trace region. The first metal forming the charge sharing capacitor is the charge sharing line of the array substrate.

The array substrate includes a plurality of the scanning lines along a row direction, and a plurality of the charge sharing lines. The pixel unit of the nth row is electrically connected to the scanning line of the nth row, and the second metal layer of the pixel unit of the nth row is insulated from and overlapped with the charge sharing line of the nth row, wherein n is a positive integer.

The pixel unit of the array substrate is a Tri-gate structure, and the first metal forming the charge sharing capacitor is the scanning line.

The array substrate includes a plurality of the scanning lines along row direction. The pixel unit of the mth row is electrically connected to the scanning line of the mth row, and the second metal layer of the pixel unit of the mth row is insulated from and overlapped with the scanning line of the (m+1)th row, wherein m is a positive integer.

The array substrate further includes a plurality of data lines along a column direction, a first thin film transistor, a first storage capacitor, and a second thin film transistor and a second storage capacitor electrically connected to each other. In the first thin film transistor, a gate electrode is electrically connected to the scanning lines, a source electrode is electrically connected to the data lines, and a drain electrode is electrically connected to one end of the first storage capacitor. The other end of the first storage capacitor is electrically connected to a common electrode. In the second thin film transistor, a gate electrode is electrically connected to the scanning lines, a source electrode is electrically connected to the data lines, and a drain electrode is electrically connected to one end of the second storage capacitor. The other end of the second storage capacitor is electrically connected to the common electrode. In the charge sharing thin film transistor, a gate electrode is electrically connected to the charge sharing line, the other one of a source electrode and a drain electrode is electrically connected to the drain electrode of the second thin film transistor.

The second metal layer forming the charge sharing capacitor is connected to the common electrode through a via hole.

According to embodiments of the present invention, the liquid crystal display panel includes an array substrate, a color filter substrate opposite to the array substrate, and liquid crystal disposed between the array substrate and the color filter substrate. The array substrate includes a base substrate, a first metal layer, an insulating layer, and a second metal layer subsequently formed on the substrate. The first metal layer is scan lines or charge sharing lines of the array substrate. The second metal layer is one of a source electrode and drain electrode of a charge sharing thin film transistor of the array substrate. The first metal layer, the second metal layer, and the insulating layer between them are stacked together to form a charge sharing capacitor of the array substrate.

The array substrate is divided to a plurality of pixel units. Each of the pixel units includes a main pixel region, a sub pixel region, and a trace region between the two pixel regions. Each of the pixel units is connected to one of the scanning lines and one of the charge sharing lines. One of the scanning lines and one of the charge sharing lines are disposed side by side in the trace region. The first metal forming the charge sharing capacitor is the charge sharing line of the array substrate.

The array substrate includes a plurality of the scanning lines along a row direction, and a plurality of the charge sharing lines. The pixel unit of the nth row is electrically connected to the scanning line of the nth row, and the second metal layer of the pixel unit of the nth row is insulated from and overlapped with the charge sharing line of the nth row, wherein n is a positive integer.

The pixel unit of the array substrate is a Tri-gate structure, and the first metal forming the charge sharing capacitor is the scanning line.

The array substrate includes a plurality of the scanning lines along row direction. The pixel unit of the mth row is electrically connected to the scanning line of the mth row, and the second metal layer of the pixel unit of the mth row is insulated from and overlapped with the scanning line of the (m+1)th row, wherein m is a positive integer.

The array substrate further includes a plurality of data lines along a column direction, a first thin film transistor, a first storage capacitor, and a second thin film transistor and a second storage capacitor electrically connected to each other. In the first thin film transistor, a gate electrode is electrically connected to the scanning lines, a source electrode is electrically connected to the data lines, and a drain electrode is electrically connected to one end of the first storage capacitor. The other end of the first storage capacitor is electrically connected to a common electrode. In the second thin film transistor, a gate electrode is electrically connected to the scanning lines, a source electrode is electrically connected to the data lines, and a drain electrode is electrically connected to one end of the second storage capacitor. The other end of the second storage capacitor is electrically connected to the common electrode. In the charge sharing thin film transistor, a gate electrode is electrically connected to the charge sharing line, the other one of a source electrode and a drain electrode is electrically connected to the drain electrode of the second thin film transistor.

The second metal layer forming the charge sharing capacitor is connected to the common electrode through a via hole.

According to embodiments of the present invention, the liquid crystal display device includes a liquid crystal display panel and a light source module providing light to the liquid crystal display panel. The liquid crystal display panel includes an array substrate, a color filter substrate opposite to the array substrate, and liquid crystal disposed between the array substrate and the color filter substrate. The array substrate includes a base substrate, a first metal layer, an insulating layer, and a second metal layer subsequently formed on the substrate. The first metal layer is scan lines or charge sharing lines of the array substrate. The second metal layer is one of a source electrode and drain electrode of a charge sharing thin film transistor of the array substrate. The first metal layer, the second metal layer, and the insulating layer between them are stacked together to form a charge sharing capacitor of the array substrate.

The array substrate is divided to a plurality of pixel units. Each of the pixel units includes a main pixel region, a sub pixel region, and a trace region between the two pixel regions. Each of the pixel units is connected to one of the scanning lines and one of the charge sharing lines. One of the scanning lines and one of the charge sharing lines are disposed side by side in the trace region. The first metal forming the charge sharing capacitor is the charge sharing line of the array substrate.

The array substrate includes a plurality of the scanning lines along a row direction, and a plurality of the charge sharing lines. The pixel unit of the nth row is electrically connected to the scanning line of the nth row, and the second metal layer of the pixel unit of the nth row is insulated from and overlapped with the charge sharing line of the nth row, wherein n is a positive integer.

The pixel unit of the array substrate is a Tri-gate structure, and the first metal forming the charge sharing capacitor is the scanning line.

The array substrate includes a plurality of the scanning lines along row direction, the pixel unit of the mth row is electrically connected to the scanning line of the mth row, and the second metal layer of the pixel unit of the mth row is insulated from and overlapped with the scanning line of the (m+1)th row, wherein m is a positive integer.

The array substrate further includes a plurality of data lines along a column direction, a first thin film transistor, a first storage capacitor, and a second thin film transistor and a second storage capacitor electrically connected to each other. In the first thin film transistor, a gate electrode is electrically connected to the scanning lines, a source electrode is electrically connected to the data lines, and a drain electrode is electrically connected to one end of the first storage capacitor. The other end of the first storage capacitor is electrically connected to a common electrode. In the second thin film transistor, a gate electrode is electrically connected to the scanning lines, a source electrode is electrically connected to the data lines, and a drain electrode is electrically connected to one end of the second storage capacitor. The other end of the second storage capacitor is electrically connected to the common electrode. In the charge sharing thin film transistor, a gate electrode is electrically connected to the charge sharing line, the other one of a source electrode and a drain electrode is electrically connected to the drain electrode of the second thin film transistor. The second metal layer forming the charge sharing capacitor is connected to the common electrode through a via hole.

According to embodiments of the present invention, in the array substrate, the liquid crystal display panel and the liquid crystal display device, the second metal layer forming the charge sharing capacitor is insulated from and overlapped with the charge sharing line or the scanning line. Since the charge sharing line or the scanning line is originally located in the non-display region, the second metal line with shielding will not occupy area of the display region, thus increasing the pixel aperture ratio.

DETAILED DESCRIPTION OF THE INVENTION

In the following, the technology in the embodiments of the present invention will be described in detail by incorporating the appended figures and embodiments.

Figure 1:
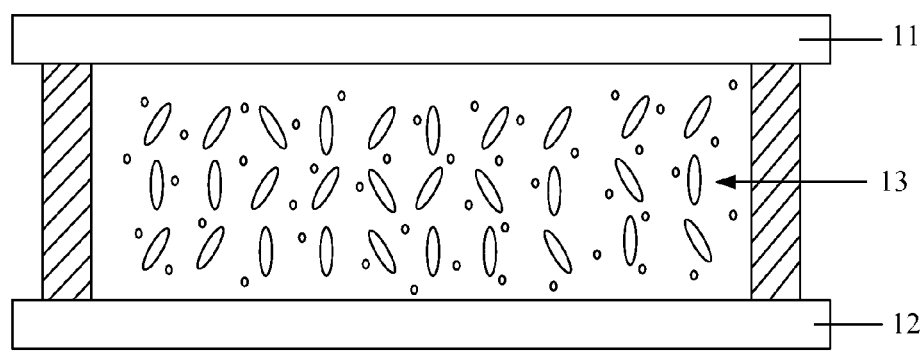
FIG. 1 is a cross-sectional view of the liquid crystal display panel according to an embodiment of the present invention.
Figure 2:
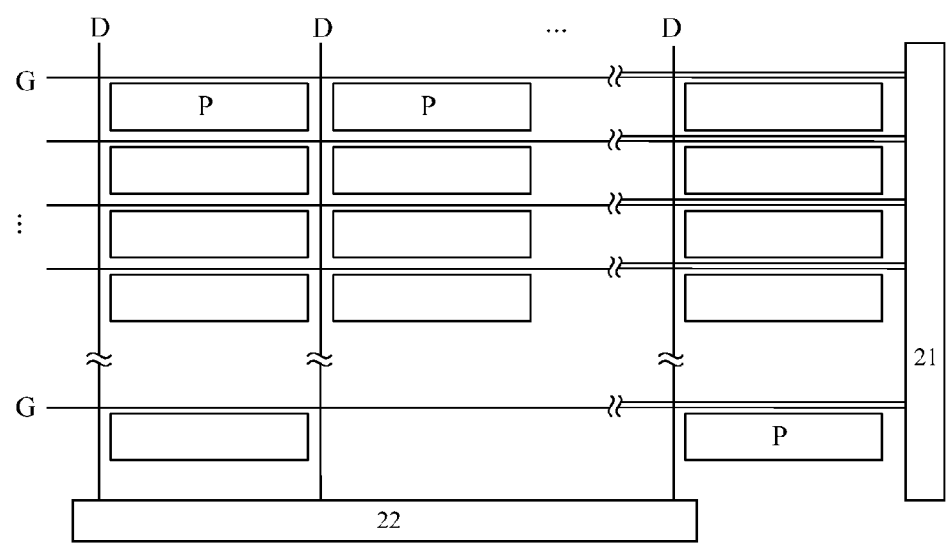
FIG. 2 is a schematic diagram showing the pixel structure of the liquid crystal display panel of FIG. 1 according to an embodiment.

FIG. 1 is a cross-sectional view showing a liquid crystal display panel according to an embodiment of the present invention. FIG. 2 is a schematic diagram showing a pixel structure of the liquid crystal display panel of FIG. 1. Referring to FIG. 1 and FIG. 2, the liquid crystal display panel 10 includes a color filter substrate (CF substrate) 11, an array substrate (a thin film transistor substrate; TFT substrate) 12 disposed opposite to the CF substrate, and a liquid crystal layer 13 filled between the two substrates. The array substrate 12 includes a plurality of data lines D along a column direction, a plurality of scanning lines G along a row direction, and a plurality of pixel units P defined by the plurality of scanning lines G and the plurality of data lines D. Each pixel unit P is connected to a corresponding data line and a corresponding scanning line G. Each scanning line G is connected to a gate driver 21 to provide scanning voltage to each pixel unit P. Each data line D is connected to a source driver 22 to provide gray level voltage to each pixel unit P.

The pixel units P are disposed in an array arrangement and have the same structure. Therefore, in the following, one pixel unit 30, as shown in FIG. 3, located on the nth row is taken for an example for explanation, wherein n is a positive integer.

Figure 3:
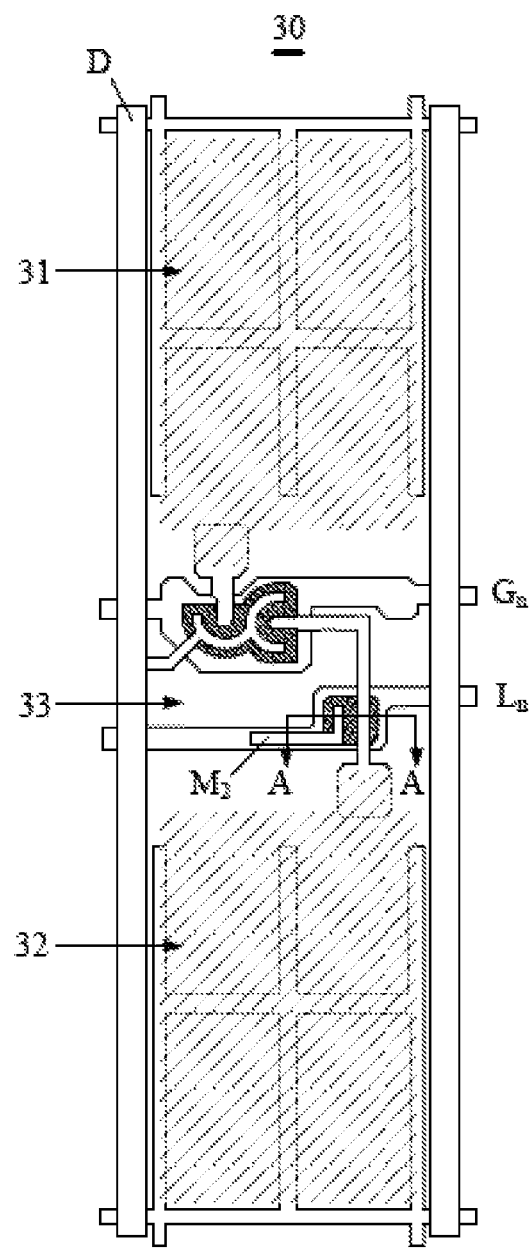
FIG. 3 is a schematic diagram showing one pixel unit of FIG. 2.

Referring to FIG. 3, the pixel unit 30 includes a main pixel region 31, a sub pixel region 32, and a trace region 33 located between the main pixel 31 and the sub pixel 32. The pixel unit 30 is electrically connected to the scanning line Gn on the nth row and the charge sharing line Ln on the nth row respectively. The scanning line Gn and the charge sharing line Ln are arranged parallel in the trace region 33.

Figure 4:
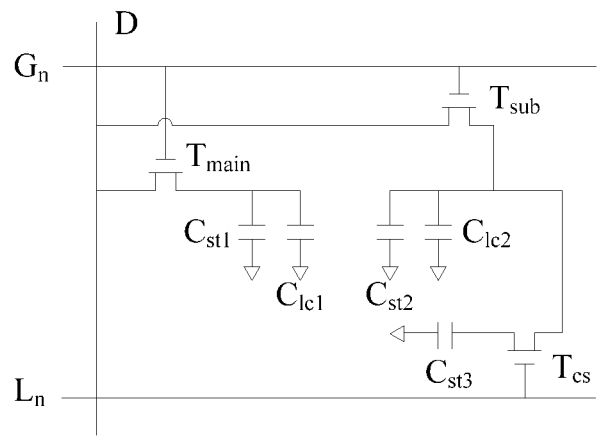
FIG. 4 is an equivalent circuit diagram of the pixel structure of FIG. 3.

FIG. 4 is an equivalent circuit diagram of the pixel structure of FIG. 3. Referring to FIG. 4, the array substrate 12 includes a charge sharing thin film transistor Tcs, a charge sharing capacitor Cst3, a first thin film transistor Tmain, a storage capacitor Cst1, a first liquid crystal capacitor Clc1, a second thin film transistor Tsub, a second storage capacitor Cst2, and a second liquid crystal capacitor Clc2, wherein:

the first liquid crystal capacitor Clc1 is formed by a pixel electrode located in the main pixel region 31, a common electrode of the liquid crystal display panel 10, and the liquid crystal layer 13 between them;

the second liquid crystal capacitor Clc2 is formed by a pixel electrode located in the sub pixel region 32, the common electrode of the liquid crystal display panel 10, and the liquid crystal layer 13 between them;

the first storage capacitor Cst1 is formed by a source electrode or drain electrode of the charge sharing thin film transistor Tcs of the thin film transistor substrate 12, the common electrode of the liquid crystal display panel 10 of the main pixel region 31, and an insulating layer between them;

the second storage capacitor Cst2 is formed by a source electrode or drain electrode of the charge sharing thin film transistor Tcs of the thin film transistor substrate 12, the common electrode of the liquid crystal display panel 10 of the sub pixel region 32, and an insulating layer between them;

the gate electrode of the first thin film transistor Tmain is electrically connected to the scanning line Gn, the source electrode is electrically connected to the data line D, the drain electrode is electrically connected to an end of the first storage capacitor Cst1, the other end of the first storage capacitor Cst1 is electrically connected to the common electrode of the liquid crystal display panel 10;

the gate electrode of the second thin film transistor Tsub is electrically connected to the scanning line Gn, the source electrode is electrically connected to the data line D, the drain electrode is electrically connected to an end of the second storage capacitor Cst2, the other end of the second storage capacitor Cst2 is electrically connected to the common electrode of the liquid crystal display panel 10;

the gate electrode of the charge sharing thin film transistor Tcs is electrically connected to the charge share line Ln, one of the source electrode and the drain electrode is electrically connected to the drain electrode of the second thin film transistor Tsub, the other of the source electrode and the drain electrode is electrically connected to one end of the charge sharing capacitor Cst3, the other end of the charge sharing capacitor Cst3 is electrically connected to the common electrode of the liquid crystal display panel 10.

In the normal displaying, after receiving the scanning voltage of the gate driver 21, the scanning line Gn is turned on, and the charge sharing scanning line Ln is turned off simultaneously. The main pixel region 31 and the sub pixel region 32 are charged to the same electric potential. Afterwards, the gate driver 21 stops to provide scanning voltage, so as to turn off the scanning line Gn and turn on the charge sharing line Ln simultaneously. Due to the effect of the charge sharing capacitor Cst3, the electric potential of the sub pixel region 32 is lower than the electric potential of the main pixel region 31. Different electric potential causes the liquid crystal molecules in the two display regions to have different orientation, thus improving color shift at large viewing angle.

Figure 5:
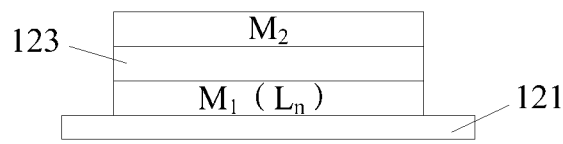
FIG. 5 is a structural cross-sectional view of the array substrate of FIG. 1, taken along line A-A of FIG. 3.

FIG. 5 is a structural cross-sectional view of the array substrate 12 of FIG. 1, taken along line A-A of FIG. 3. Referring to FIG. 5, in the array substrate 12 applying the charge sharing technology, the charge sharing capacitor Cst3 is formed by stacking a first metal layer M1, a second metal layer M2, and an insulating layer 123 between them. The first metal layer M1, the insulating layer 123, and the second metal layer M2 is subsequently formed on a base substrate 121. The first metal layer M1 is the charge sharing line Ln of the array substrate 12 shown in FIG. 4, the second metal layer M2 is the source electrode or drain electrode of the charge sharing thin film transistor Tcs of the array substrate 12 in FIG. 4. The second metal layer M2 forming the charge sharing capacitor Cst3 is connected to the common electrode of the liquid crystal display panel 10 through the via hole.

Referring to FIG. 3 again, according to the embodiment, the second metal layer M2 forming the charge sharing capacitor Cst3 is overlapped with the charge sharing line Ln or the scanning line Gn. Since the charge sharing line Ln or the scanning line Gn is originally located in the non-display region, the second metal layer M2 with shielding will not occupy area of the display region. Moreover, each pixel unit P includes the first metal layer M1, the insulating layer 123, and the second metal layer M2, thus increasing pixel aperture ratio.

Figure 6:
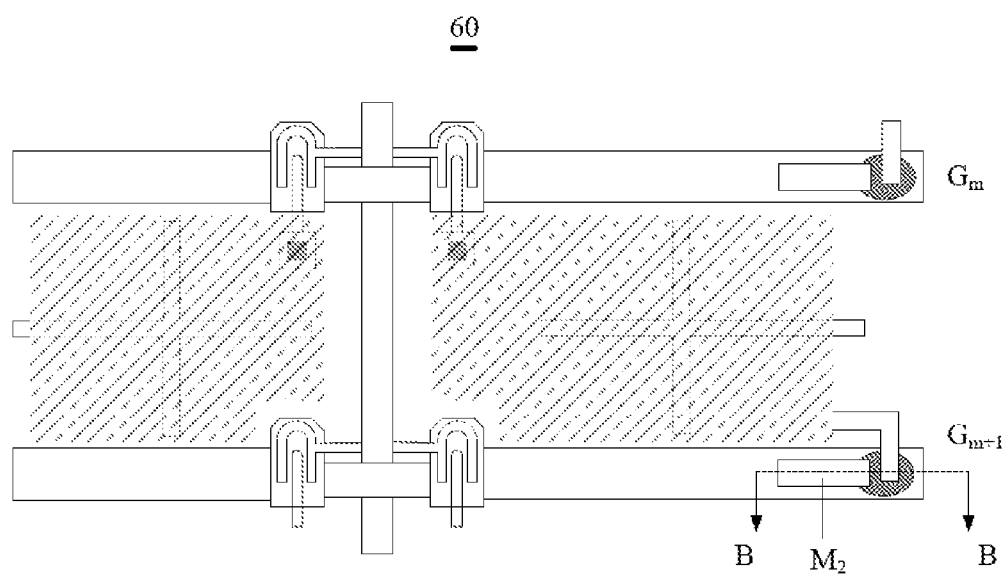
FIG. 6 is a schematic diagram showing one pixel unit with Tri-gate structure according to the present invention.

Regarding the pixel unit of the array substrate 12 is of Tri-gate structure, the pixel unit 60 on the mth row in FIG. 6 is a representative embodiment, wherein m is a positive integer.

Figure 7:
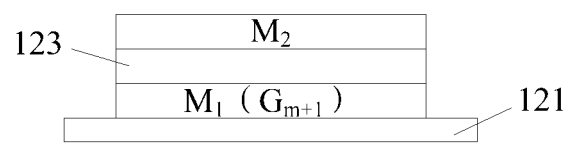
FIG. 7 is a structural cross-sectional view taken along line B-B of FIG. 6.

Referring to FIG. 6 in combination to the cross-sectional view of FIG. 7, the pixel unit 60 is electrically connected to the scanning line Gm on the mth row. This embodiment is based on the above embodiments, but differs in that the charge sharing capacitor Cst3 of the array substrate 12 is formed by the second metal layer M2 in the pixel unit 60 on the mth row insulated from and overlapped with the scanning line Gm+1 on the (m+1)th row. That is, the first metal layer M1 forming the charge sharing capacitor Cst3 is the scanning line Gm+1, but not the charge sharing line.

Figure 8:
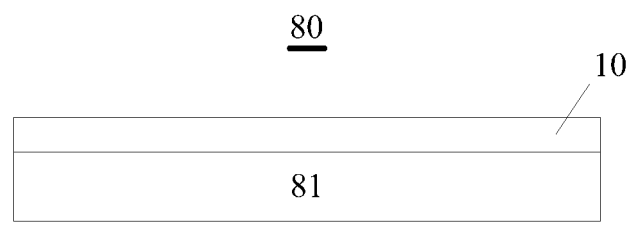
FIG. 8 is a schematic diagram showing the liquid crystal display device according to an embodiment of the present invention.

According to an embodiment of the present invention, a liquid crystal display device 80 as shown in FIG. 8 is provided. The liquid crystal display device 80 includes the above-mentioned liquid crystal display panel 10 and a light source module 81 providing light to the liquid crystal display panel 10. Since the liquid crystal display device 80 also includes the array substrate 12 with the above design, it also has the same effect.

The scope of the present invention is not limited by the above-mentioned embodiments. Changes on the equivalent structure or equivalent process based on the specification and appended figures of the present invention are within the scope of the present invention, for example, combination between technology of various embodiments, or direct or indirect utilization to other related technology.

The invention claimed is:

1. An array substrate, comprising a base substrate, a first metal layer, an insulating layer, and a second metal layer subsequently formed on the base substrate,
   wherein the first metal layer is scan lines or charge sharing lines of the array substrate,
   wherein the second metal layer is one of a source electrode and drain electrode of a charge sharing thin film transistor of the array substrate,
   wherein the first metal layer, the second metal layer, and the insulating layer between them are stacked together to form a charge sharing capacitor of the array substrate; and
   wherein the array substrate is divided to a plurality of pixel units, each of the pixel units includes a main pixel region, a sub pixel region, and a trace region between the two pixel regions, each of the pixel units is connected to one of the scanning lines and one of the charge sharing lines, one of the scanning lines and one of the charge sharing lines are disposed side by side in the trace region, and the first metal forming the charge sharing capacitor is the charge sharing line of the array substrate.

2. The array substrate as claimed in claim 1, wherein the array substrate includes a plurality of the scanning lines along a row direction, and a plurality of the charge sharing lines,
   wherein the pixel unit of the nth row is electrically connected to the scanning line of the nth row, and the second metal layer of the pixel unit of the nth row is insulated from and overlapped with the charge sharing line of the nth row, wherein n is a positive integer.

3. The array substrate as claimed in claim 1, wherein the pixel unit of the array substrate is a Tri-gate structure, and the first metal forming the charge sharing capacitor is the scanning line.

4. The array substrate as claimed in claim 3, wherein the array substrate includes a plurality of the scanning lines along row direction, the pixel unit of the mth row is electrically connected to the scanning line of the mth row, and the second metal layer of the pixel unit of the mth row is insulated from and overlapped with the scanning line of the (m+1)th row, wherein m is a positive integer.

5. The array substrate as claimed in claim 1,
   wherein the array substrate further includes a plurality of data lines along a column direction, a first thin film transistor, a first storage capacitor, a second thin film transistor, and a second storage capacitor,
   wherein in the first thin film transistor, a gate electrode is electrically connected to the scanning lines, a source electrode is electrically connected to the data lines, and a drain electrode is electrically connected to one end of the first storage capacitor,
   wherein the other end of the first storage capacitor is electrically connected to a common electrode,
   wherein in the second thin film transistor, a gate electrode is electrically connected to the scanning lines, a source electrode is electrically connected to the data lines, and a drain electrode is electrically connected to one end of the second storage capacitor,
   wherein the other end of the second storage capacitor is electrically connected to the common electrode, and
   wherein in the charge sharing thin film transistor, a gate electrode is electrically connected to the charge sharing line, the other one of a source electrode and a drain electrode is electrically connected to the drain electrode of the second thin film transistor.

6. The array substrate as claimed in claim 5, wherein the second metal layer forming the charge sharing capacitor is connected to the common electrode through a via hole.

7. A liquid crystal display panel, wherein the liquid crystal display panel includes an array substrate, a color filter substrate opposite to the array substrate, and liquid crystal disposed between the array substrate and the color filter substrate,
   wherein the array substrate includes a base substrate, a first metal layer, an insulating layer, and a second metal layer subsequently formed on the substrate,
   wherein the first metal layer is scan lines or charge sharing lines of the array substrate,
   wherein the second metal layer is one of a source electrode and drain electrode of a charge sharing thin film transistor of the array substrate,
   wherein the first metal layer, the second metal layer, and the insulating layer between them are stacked together to form a charge sharing capacitor of the array substrate; and
   wherein the array substrate is divided to a plurality of pixel units, each of the pixel units includes a main pixel region, a sub pixel region, and a trace region between the two pixel regions, each of the pixel units is connected to one of the scanning lines and one of the charge sharing lines, one of the scanning lines and one of the charge sharing lines are disposed side by side in the trace region, and the first metal forming the charge sharing capacitor is the charge sharing line of the array substrate.

8. The liquid crystal display panel as claimed in claim 7,
   wherein the array substrate includes a plurality of the scanning lines along a row direction, and a plurality of the charge sharing lines,
   wherein the pixel unit of the nth row is electrically connected to the scanning line of the nth row, and the second metal layer of the pixel unit of the nth row is insulated from and overlapped with the charge sharing line of the nth row, wherein n is a positive integer.

9. The liquid crystal display panel as claimed in claim 7, wherein the pixel unit of the array substrate is a Tri-gate structure, and the first metal forming the charge sharing capacitor is the scanning line.

10. The liquid crystal display panel as claimed in claim 9, wherein the array substrate includes a plurality of the scanning lines along row direction, the pixel unit of the mth row is electrically connected to the scanning line of the mth row, and the second metal layer of the pixel unit of the mth row is insulated from and overlapped with the scanning line of the (m+1)th row, wherein m is a positive integer.

11. The liquid crystal display panel as claimed in claim 7,
   wherein the array substrate further includes a plurality of data lines along a column direction, a first thin film transistor, a first storage capacitor, a second thin film transistor, and a second storage capacitor,
   wherein in the first thin film transistor, a gate electrode is electrically connected to the scanning lines, a source electrode is electrically connected to the data lines, and a drain electrode is electrically connected to one end of the first storage capacitor, wherein the other end of the first storage capacitor is electrically connected to a common electrode, wherein in the second thin film transistor, a gate electrode is electrically connected to the scanning lines, a source electrode is electrically connected to the data lines, and a drain electrode is electrically connected to one end of the second storage capacitor, wherein the other end of the second storage capacitor is electrically connected to the common electrode, and wherein in the charge sharing thin film transistor, a gate electrode is electrically connected to the charge sharing line, the other one of a source electrode and a drain electrode is electrically connected to the drain electrode of the second thin film transistor.

12. The liquid crystal display panel as claimed in claim 11, wherein the second metal layer forming the charge sharing capacitor is connected to the common electrode through a via hole.

13. A liquid crystal display device, wherein the liquid crystal display device includes a liquid crystal display panel and a light source module providing light to the liquid crystal display panel, wherein the liquid crystal display panel includes an array substrate, a color filter substrate opposite to the array substrate, and liquid crystal disposed between the array substrate and the color filter substrate, wherein the array substrate includes a base substrate, a first metal layer, an insulating layer, and a second metal layer subsequently formed on the substrate, wherein the first metal layer is scan lines or charge sharing lines of the array substrate, wherein the second metal layer is one of a source electrode and drain electrode of a charge sharing thin film transistor of the array substrate, wherein the first metal layer, the second metal layer, and the insulating layer between them are stacked together to form a charge sharing capacitor of the array substrate; and wherein the array substrate is divided to a plurality of pixel units, each of the pixel units includes a main pixel region, a sub pixel region, and a trace region between the two pixel regions, each of the pixel units is connected to one of the scanning lines and one of the charge sharing lines, one of the scanning lines and one of the charge sharing lines are disposed side by side in the trace region, and the first metal forming the charge sharing capacitor is the charge sharing line of the array substrate.

14. The liquid crystal display device as claimed in claim 13, wherein the array substrate includes a plurality of the scanning lines along a row direction, and a plurality of the charge sharing lines, wherein the pixel unit of the nth row is electrically connected to the scanning line of the nth row, and the second metal layer of the pixel unit of the nth row is insulated from and overlapped with the charge sharing line of the nth row, wherein n is a positive integer.

15. The liquid crystal display device as claimed in claim 13, wherein the pixel unit of the array substrate is a Tri-gate structure, and the first metal forming the charge sharing capacitor is the scanning line.

16. The liquid crystal display device as claimed in claim 15, wherein the array substrate includes a plurality of the scanning lines along row direction, the pixel unit of the mth row is electrically connected to the scanning line of the mth row, and the second metal layer of the pixel unit of the mth row is insulated from and overlapped with the scanning line of the (m+1)th row, wherein m is a positive integer.

17. The liquid crystal display device as claimed in claim 13, wherein the array substrate further includes a plurality of data lines along a column direction, a first thin film transistor, a first storage capacitor, a second thin film transistor, and a second storage capacitor, wherein in the first thin film transistor, a gate electrode is electrically connected to the scanning lines, a source electrode is electrically connected to the data lines, and a drain electrode is electrically connected to one end of the first storage capacitor, wherein the other end of the first storage capacitor is electrically connected to a common electrode, wherein in the second thin film transistor, a gate electrode is electrically connected to the scanning lines, a source electrode is electrically connected to the data lines, and a drain electrode is electrically connected to one end of the second storage capacitor, wherein the other end of the second storage capacitor is electrically connected to the common electrode, and wherein in the charge sharing thin film transistor, a gate electrode is electrically connected to the charge sharing line, the other one of a source electrode and a drain electrode is electrically connected to the drain electrode of the second thin film transistor, wherein the second metal layer forming the charge sharing capacitor is connected to the common electrode through a via hole.

* * * * *